(12) United States Patent
Bu et al.

(10) Patent No.: US 7,586,792 B1
(45) Date of Patent: Sep. 8, 2009

(54) SYSTEM AND METHOD FOR PROVIDING DRAIN AVALANCHE HOT CARRIER PROGRAMMING FOR NON-VOLATILE MEMORY APPLICATIONS

(75) Inventors: Jiankang Bu, Windham, ME (US); William S. Belcher, Cape Elizabeth, ME (US); David Courtney Parker, Topsham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 246 days.

(21) Appl. No.: 11/509,790

(22) Filed: Aug. 24, 2006

(51) Int. Cl.
*G11C 16/04* (2006.01)

(52) U.S. Cl. .............................. 365/185.28; 365/185.26; 365/185.18

(58) Field of Classification Search ............ 365/185.14, 365/185.28, 185.19
See application file for complete search history.

(56) References Cited

U.S. PATENT DOCUMENTS 7,391,647 B2 * 6/2008 Fang et al. ............. 365/185.18

* cited by examiner

*Primary Examiner*—Hoai V Ho
*Assistant Examiner*—Kretelia Graham

(57) ABSTRACT

A system and method are disclosed for providing drain avalanche hot carrier (DAHC) programming for non-volatile memory (NVM) applications. A memory cell of the present invention comprises a program transistor and a control capacitor, each having a gate coupled together to form a floating gate. The size of the program transistor is selected to create a coupling ratio between the program transistor and the control capacitor that is large enough to facilitate a Fowler-Nordheim erase process and small enough to facilitate DACH programming. A source bias voltage is supplied to the source of the program transistor to increase the hot electron injection rate and to decrease the hot electron generation rate in the memory cell.

20 Claims, 4 Drawing Sheets

SOURCE BIAS
VOLTAGE LINE

SYSTEM AND METHOD FOR PROVIDING DRAIN AVALANCHE HOT CARRIER PROGRAMMING FOR NON-VOLATILE MEMORY APPLICATIONS

TECHNICAL FIELD OF THE INVENTION

The present invention is generally directed to the manufacture of integrated circuits and, in particular, to a system and method for providing drain avalanche hot carrier (DAHC) programming in non-volatile memory (NVM) applications.

BACKGROUND OF THE INVENTION

A fundamental design challenge in creating a memory cell of an electrically erasable programmable read only memory (EEPROM) device is to use a controllable and reproducible electrical effect that has sufficient non-linearity so that the memory cell (1) can be written to (or erased) at one voltage in less than one millisecond (1 ms) and can be read at another voltage, and (2) the data within the memory cell must remain unchanged for more than ten (10) years.

Prior art stacked/split gate EEPROM technology requires (1) special multi-polysilicon materials, (2) different gate oxide thicknesses, and (3) modified doping profiles. These prior art requirements create process complexity and high cost when embedded into a complementary metal oxide semiconductor (CMOS) process.

FIG. 1 illustrates a schematic diagram of a prior art memory cell 100 of an erasable programmable read only memory (EEPROM) device. Memory cell 100 comprises one P-channel metal oxide semiconductor (PMOS) transistor 110 and one P-channel metal oxide semiconductor (PMOS) capacitor 120. The PMOS capacitor 120 is formed by connecting together the source, drain and substrate of a PMOS transistor.

The PMOS transistor 110 may be referred to as PMOS program transistor 110. The PMOS capacitor 120 may be referred to as PMOS control capacitor 120. The gate of the PMOS program transistor 110 and the gate of the PMOS control capacitor 120 are connected together (i.e., shorted together) and are isolated from the other active elements. The shorted gates of the PMOS program transistor 110 and the PMOS control capacitor 120 are collectively referred to as a "floating gate" 130. Charges (in amounts that represent either a zero (0) representation or a one (1) representation) may be written to the floating gate 130. In order to avoid well bias interference, the PMOS program transistor 110 and the PMOS control capacitor 120 are each located in a separate N well.

The prior art memory cell 100 is written to by injecting drain avalanche hot electrons into the floating gate 130. For PMOS operation (as shown in FIG. 1) low voltage is applied to the control gate and drain of PMOS control capacitor 120 and high voltage is applied to the source/well of PMOS program transistor 110. The channel of PMOS program transistor 110 is turned on and hot electrons are generated at the high electric field region at the drain junction (designated "$V_{INJ}$" in FIG. 1). With positive voltage on the control gate of PMOS control transistor 120, some hot electrons with high energy will pass through the silicon-silicon dioxide (Si—SiO2) potential barrier and be injected into the floating gate 130.

The prior art memory cell 100 is erased by applying a high voltage to the control gate of the PMOS control transistor 120 and to the ground drain and source of the PMOS program transistor 110. Electrons on the floating gate 130 will pass through the gate oxide between the floating gate 130 and the control gate of the PMOS control capacitor 120 by Fowler-Nordheim (FN) tunneling process and go to the substrate.

During programming, most control gate voltage should be coupled between the floating gate 130 and the drain/source of the PMOS program transistor 110 to facilitate electron injection to the floating gate 130 but not further to the control gate of the PMOS control transistor 120. This requires the capacitance between the floating gate 130 and the control gate to be large. On the other hand, during the erase procedure, more control gate voltage should be coupled between the floating gate 130 and the control gate, so that electrons can tunnel from the floating gate 130 to the substrate by the Fowler-Nordheim (FN) tunneling process. This requires the capacitance between the floating gate 130 and the control gate to be small.

These two contradictory requirements for the control gate capacitance during the program procedure and the erase procedure leave a narrower operation window. This results in poor data retention and slower speeds for an EEPROM that comprises one PMOS program transistor and one PMOS control capacitor.

To improve the operational speed and data retention for an EEPROM device, EEPROM designers have sometimes placed an additional capacitor in the basic memory cell. This approach has one large capacitor for the programming operation and one small capacitor for the erase operation. Capacitor coupling techniques are used to achieve a favorable electric field for both the programming operation and the erase operation.

The floating gate of an added capacitor has to be filled with hot electrons. Hot electrons that pass through gate oxide will create oxide damage. Oxide damage degrades the endurance of a memory cell. Endurance is measured by how many program/erase cycles the gate oxide can tolerate before unacceptable damage occurs. Therefore, one major drawback to adding an extra capacitor is that it degrades EEPROM memory cell endurance performance.

Another drawback to adding an extra capacitor is that it significantly increases the size of the basic memory cell. This significantly lowers the EEPROM density. Additional chip area is required for the extra capacitors. This increases the cost.

Another drawback of prior art CMOS EEPROM technology is the speed of the programming procedure. The programming procedure is carried out by utilizing drain avalanche hot electrons. Because the efficiency of generating and injecting the drain avalanche hot electrons is low, programming times are relatively long. The programming time is usually one hundred milliseconds (100 ms) or longer. Even the improved coupling provided by using additional capacitors only reduces the programming time to about twenty milliseconds (20 ms).

FIG. 2 illustrates a schematic diagram of a prior art memory cell 200 of an erasable programmable read only memory (EEPROM) device that comprises a control capacitor and an erase capacitor. Memory cell 200 comprises program transistor 210, control capacitor 220, floating gate 230, erase capacitor 240 and read transistor 250 coupled together as shown in FIG. 2.

Prior art memory cell 200 operates in the same manner as that described for prior art memory cell 100. That is, the gate of the PMOS program transistor 210 and the gate of the PMOS control capacitor 220 are connected together (i.e., shorted together) and are isolated from the other active elements. The shorted gates of the PMOS program transistor 210 and the PMOS control capacitor 220 are collectively referred to as a "floating gate" 230. Charges (in amounts that represent either a zero (0) representation or a one (1) representation) may be written to the floating gate 230.

Prior art memory cell 200 comprises a PMOS erase capacitor 240 to facilitate the erase operation. The gate of the PMOS erase capacitor 240 is also connected to the floating gate 230. Prior art memory cell 200 also comprises a PMOS read transistor 250 to facilitate the read operation. The gate of the PMOS read transistor 250 is also connected to the floating gate 230. The PMOS read transistor 250 has nothing to do with the program/erase operations of memory cell 200.

The programming operation is carried out by Drain Avalanche Hot Carrier (DAHC) electron injection. Electrons from the edge of the drain junction of the program transistor 210 are injected into the floating gate 230. The erase operation is carried out by Fowler-Nordheim (FN) tunneling. Electrons from the floating gate 230 tunnel to the substrate of the erase capacitor 240.

FIG. 3 illustrates an illustrative memory cell layout design 300 for memory cell 200. The program transistor 210 and the erase capacitor 240 and the read transistor 250 are the same size. The program transistor 210 has an area ratio of one to twenty seven (1:27) with respect to the area of the control capacitor 220. During the operation of memory cell 200 this relatively high value for the coupling ratio helps lower the value of the erase voltage and the value of the program voltage.

However, the relatively high value for the coupling ratio leads to excess oxide damage. This is because (1) the large control capacitor 220 has to be filled up from a small hot electron injection point, and (2) during the erase process all the electrons stored on the large control capacitor 220 must be removed from a small erase point. This is one of the major reasons that complementary metal oxide semiconductor (CMOS) non-volatile memory (NVM) memory cells usually are capable of only one thousand (1,000) or so program/erase cycles. This is significantly fewer than the one hundred thousand (100,000) program/erase cycles that Flash memory can provide. The coupling ratio in Flash memory is approximately one to one and two tenths (1:1.2) or less.

Complementary metal oxide semiconductor (CMOS) non-volatile memory (NVM) memory cells should be able to perform one thousand (1,000) program/erase cycles and have a program time of approximately twenty milliseconds (20 ms). However, some CMOS NVM memory cells were found to not meet the required levels of performance. In particular, after about two hundred fifty (250) program/erase cycles some CMOS NVM memory cells became "weak programmed." The term "weak programmed" means that the read current of a memory cell becomes lower than the desired level for the read current. As the number of program/erase cycles increased, the number of failures (i.e., the number of "weak programmed" memory cells) also increased.

An investigation revealed that there are three principal factors that contribute to the creation of "weak programmed" memory cells. The first contribution is that the program/erase process causes degradation of the program current. Lower values of program current are directly related to the creation of "weak programmed" memory cells.

Experiments were conducted on a 0.44 micron by 0.40 micron metal oxide semiconductor field effect transistor (MOSFET) having a gate oxide thickness of seventy Angstroms (70 Å). Experimental data showed that if the memory cells are programmed with Drain Avalanche Hot Carrier (DAHC) programming for twenty seconds (20 s), then the program current (IG) decreases by over fifty percent (50%). If one cycle time is one hundred milliseconds (100 ms), then the DAHC stress time of twenty seconds (20 s) is equivalent to two hundred (200) program cycles.

FIG. 4 illustrates this feature in a graph 400 of program current (IG) in amperes (A) versus time in seconds (s). The drain voltage (VD) is negative six volts (−6 V) and the gate voltage (VG) is negative one and one tenth volt (−1.1 V). As shown in FIG. 4, under a constant DAHC stress, the value of the program current (i.e., the DAHC gate injection current) (IG) decreases from approximately $2.75 \times 10^{-10}$ amperes to approximately $1.04 \times 10^{-10}$ amperes in twenty seconds (20 s). Lower program current inevitably causes "weak programmed" memory cells.

The second factor that contributes to the creation of "weak programmed" memory cells comes from the fact that the EEPROM memory cell ramps up the control gate voltage during the programming process. The ramp up of control gate voltage compensates for the floating gate voltage drop that is due to the injection of more hot electrons. However, as more and more program/erase cycles occur, the program current (i.e., the DAHC gate injection current) (IG) decreases, but the control gate voltage ramps up as normal. This phenomenon increases the floating gate voltage (VFG), which decreases the channel current in the program transistor 210. Decreasing the channel current during the programming process inevitably leads to the creation of "weak programmed" memory cells.

FIG. 5 illustrates a graph 500 showing the decrease of program current (IG) in amperes (A) as the floating gate voltage (VFG) in volts (V) is increased. The drain voltage (VD) for curve A is negative five and four tenths volts (−5.4 V). The drain voltage (VD) for curve B is negative five and six tenths volts (−5.6 V). As shown in FIG. 5, if the floating gate voltage (VFG) is increased by one volt (1 V) (from a negative 1.5 volts to a negative 0.5 volt), the program current (IG) decreases by a factor of four (4).

Assume that the initial value of floating gate voltage (VFG) is set to a lower value of voltage (e.g., by changing the voltage bias or the coupling ratio). FIG. 6 illustrates a graph 600 showing that if the initial floating gate voltage (VFG) is set to a lower value of voltage, then it will take more program/erase cycles for the floating gate voltage (VFG) to shift to the same point that has the same magnitude of program current reduction. However, the value of program current will be low if this approach is taken. The drain voltage (VD) for curve A in FIG. 6 is negative five and four tenths volts (−5.4 V). The drain voltage (VD) for curve B in FIG. 6 is negative five and six tenths volts (−5.6 V).

The third factor that contributes to the creation of "weak programmed" memory cells comes from the fact that the Drain Avalanche Hot Carrier (DAHC) programming process is sensitive to the CMOS process. A change of fifty millivolts (50 mV) in the threshold voltage ($V_{th}$) is well within CMOS specifications. However, such a change can lead to a ten percent (10%) variation in the value of program current (IG). The value of the program current (IG) is also affected by other parameters, such as drain/source series resistance, drain junction doping, gate oxide thickness variation, etc. Large variations in program current (IG) may lead to increased stress in memory cells and cause early failure in the affected memory cells.

Therefore, there is a need in the art for a system and method that is capable of solving the poor performance problems described above that are exhibited by prior art memory cells in electrically erasable programmable read only memory (EEPROM) devices. In particular, there is a need in the art for a system and method for providing an improved Drain Avalanche Hot Carrier (DAHC) programming process in memory cells in electrically erasable programmable read only memory (EEPROM) devices.

The present invention provides a programming method that applies a source bias voltage to a memory cell during Drain Avalanche Hot Carrier (DAHC) programming in order to increase the hot electron injection rate and inhibit the hot electron generation rate. A larger value of the floating gate to source bias voltage provides more operation window to tolerate the shift of floating gate voltage that occurs during program/erase cycling. Shorter programming time or faster programming speed can be achieved with the higher hot electron injection efficiency provided by the present invention.

In CMOS non-volatile memory (NVM) devices, the Drain Avalanche Hot Carrier (DAHC) programming creates more oxide damage than does the FN erase process. The present invention provides an asymmetrical memory cell design to accommodate the different levels of oxide damage. The present invention provides a high coupling ratio for the FN erase process and provides a low coupling ratio for the DAHC programming by adjusting the gate capacitor area ratio. The low coupling ratio for the DAHC programming improves the cycling performance of the memory cells of the present invention.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 7 through 10, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged electrically erasable programmable read only memory (EEPROM) device.

Figure 1:
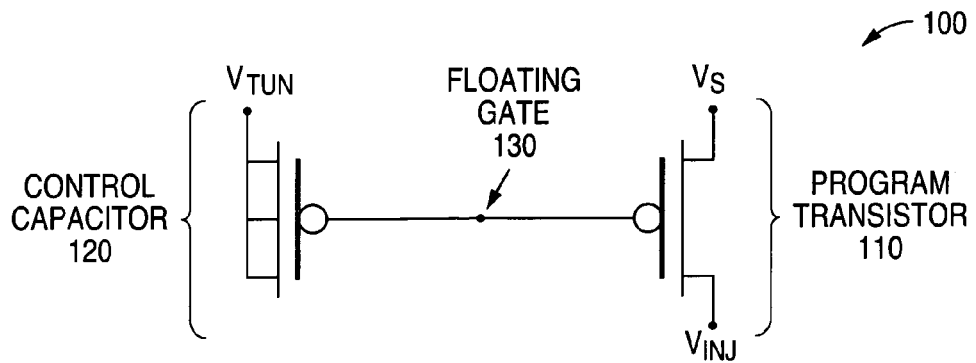
FIG. 1 illustrates a schematic diagram of a prior art memory cell of an erasable programmable read only memory (EEPROM) device that comprises a control capacitor.
Figure 2:
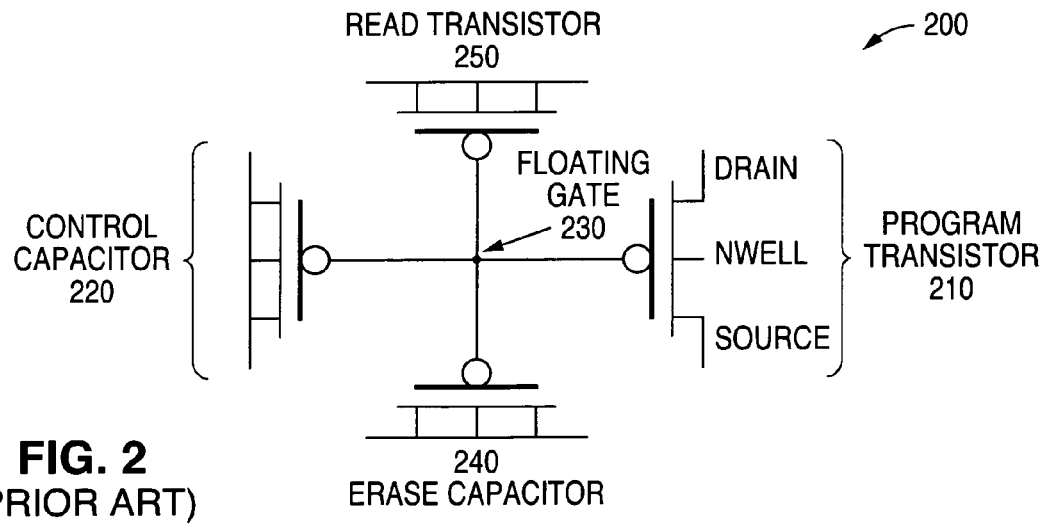
FIG. 2 illustrates a schematic diagram of a prior art memory cell of an erasable programmable read only memory (EEPROM) device that comprises a control capacitor and an erase capacitor.
Figure 3:
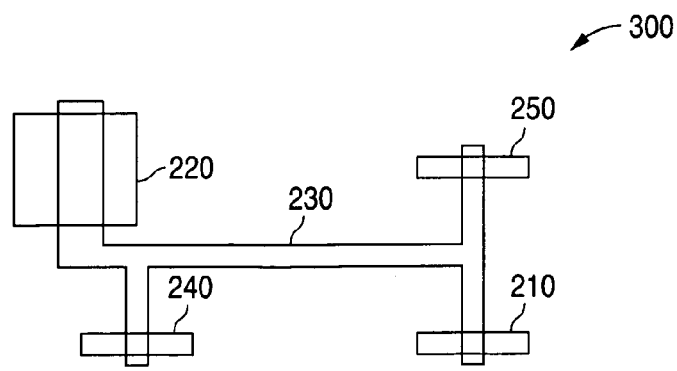
FIG. 3 illustrates a plan view of a memory cell layout design of the prior art memory cell shown in FIG. 2.
Figure 4:
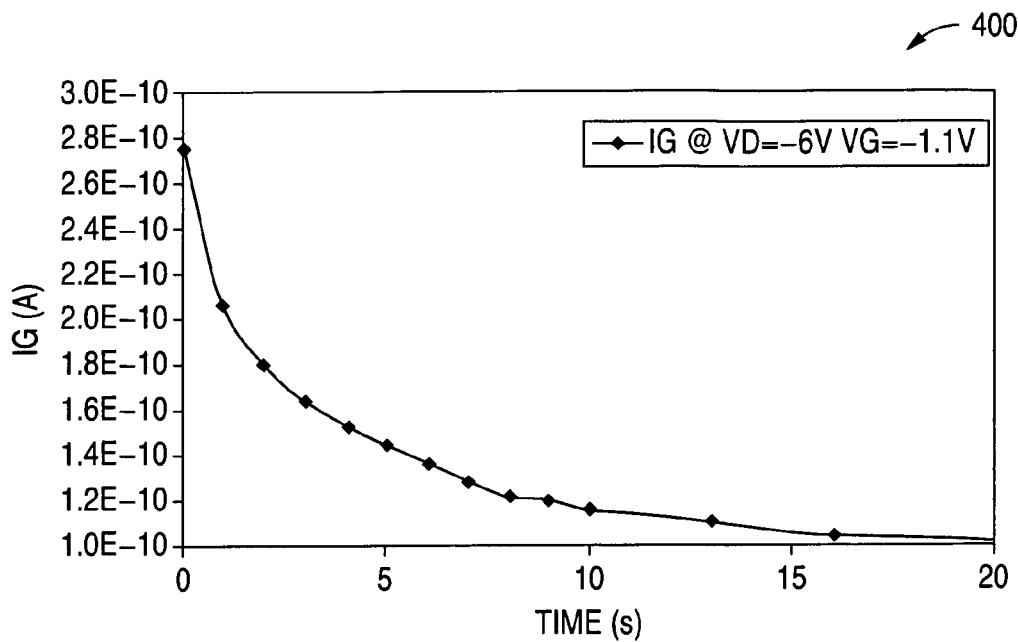
FIG. 4 illustrates a graph showing a decrease of program current versus time in a prior art memory cell.
Figure 5:
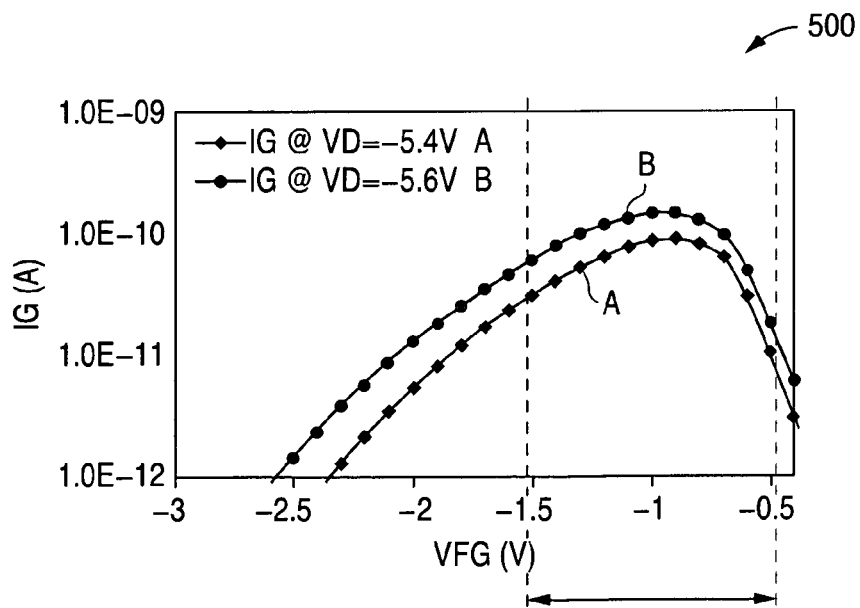
FIG. 5 illustrates a graph showing a decrease of program current in a prior art memory cell as floating gate voltage is increased.
Figure 6:
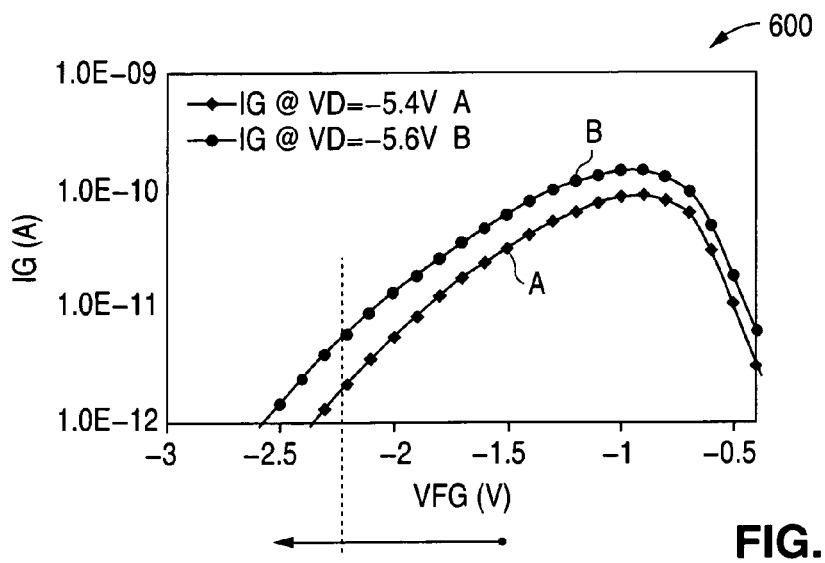
FIG. 6 illustrates a graph showing that if a low value of floating gate voltage is initially selected in a prior art memory cell, then it will take more program/erase cycles for the floating gate voltage to shift to a point that has the same magnitude of program current reduction.
Figure 7:
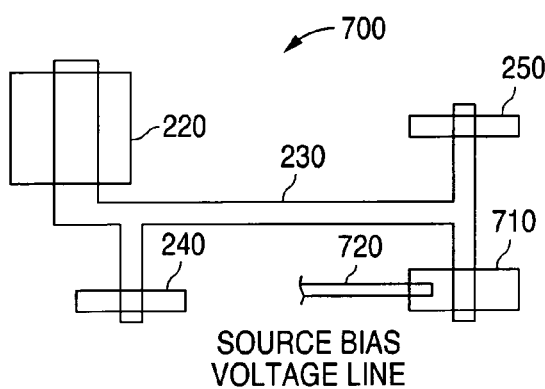
FIG. 7 illustrates a schematic diagram of a memory cell of an erasable programmable read only memory (EEPROM) device of the present invention.

FIG. 7 illustrates a schematic diagram of one advantageous embodiment of a memory cell 700 of an erasable programmable read only memory (EEPROM) device of the present invention. Memory cell 700 comprises program transistor 710, control capacitor 220, floating gate 230, erase capacitor 240 and read transistor 250 coupled together as shown in FIG. 7. In the advantageous embodiment of the invention as set forth in memory cell 700, the width of program transistor 710 is twice the width of the erase capacitor 240 and twice the width of the read transistor 250. As will be more fully discussed below, a source bias voltage line 720 is coupled to the source of program transistor 710.

It is understood that the fact that the width of program transistor 710 is twice the width of the erase capacitor 240 and twice the width of the read transistor 250 is merely one example of an embodiment of the present invention. A different width of the program transistor 710 may also be designed and used. It is understood that the present invention is not limited to a program transistor 710 that has a width that is exactly twice the width of the erase capacitor 240 or exactly twice the width of the read transistor 250. That is, the double width of the program transistor 710 is merely one example of an increased width of the program transistor 710.

Except as specifically described below, memory cell 700 operates in the same manner as that described for prior art memory cell 200. That is, the gate of the PMOS program transistor 710 and the gate of the PMOS control capacitor 220 are connected together (i.e., shorted together) and are isolated from the other active elements. The shorted gates of the PMOS program transistor 710 and the PMOS control capacitor 220 are collectively referred to as a "floating gate" 230. Charges (in amounts that represent either a zero (0) representation or a one (1) representation) may be written to the floating gate 230.

Memory cell 700 of the present invention comprises an erase capacitor 240 to facilitate the erase operation. The gate of the erase capacitor 240 is also connected to the floating gate 230. Memory cell 700 of the present invention also comprises a read transistor 250 to facilitate the read operation. The gate of the read transistor 250 is also connected to the floating gate 230. The read transistor 250 has nothing to do with the program/erase operations of memory cell 700.

The programming operation is carried out by Drain Avalanche Hot Carrier (DAHC) electron injection. Electrons from the edge of the drain junction of the program transistor 710 are injected into the floating gate 230. The erase operation is carried out by Fowler-Nordheim (FN) tunneling. Electrons from the floating gate 230 tunnel to the substrate of the erase capacitor 240.

As shown in FIG. 7, a first end of a source bias voltage line 720 is coupled to the source of program transistor 710. A second end of the source bias voltage line 720 (not shown in FIG. 7) is coupled to a voltage source. The source bias voltage line 720 provides a source bias voltage (e.g., negative two volts (−2 V)) to the source of the program transistor 710 during the DAHC programming.

Figure 8:
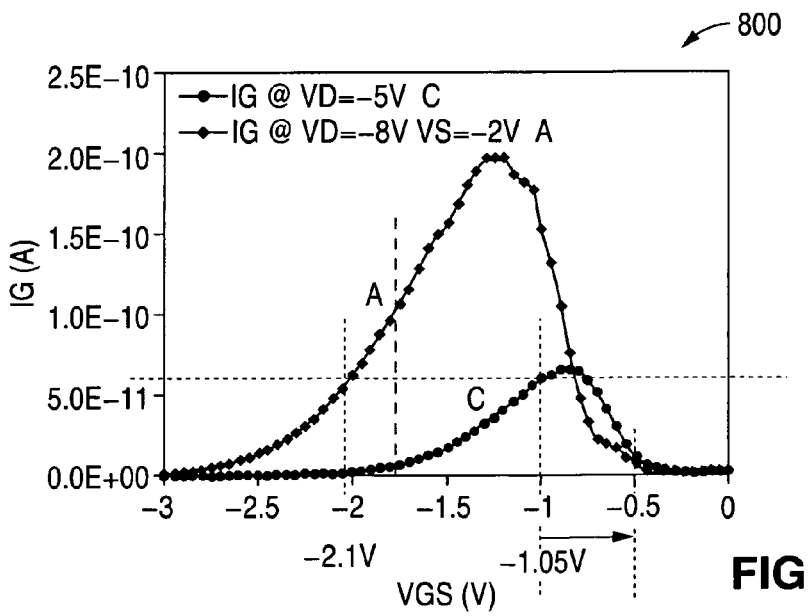
FIG. 8 illustrates a graph that shows values of program current as a function of the gate to source voltage in a memory cell of the present invention and in a prior art memory cell.

The impact of the presence of the source bias voltage on the operation of the program transistor 710 is illustrated in the graph 800 shown in FIG. 8. Graph 800 shows the program current (IG) in amperes (A) as a function of the gate to source voltage (VGS) in volts (V). Curve C in graph 800 represents the operation of the prior art memory cell 200. Curve C has a drain voltage of negative five volts (−5 V). Curve A in graph 800 represents the operation of the memory cell 700 of the present invention with a source bias voltage of negative two volts (−2 V). Curve A has a drain voltage of negative eight volts (−8 V).

For example, consider a selected value of program current (IG) of approximately $0.6 \times 10^{-10}$ amperes. The horizontal line in FIG. 8 through the $0.6 \times 10^{-10}$ amperes value crosses the first portion of curve A at a value of gate to source voltage (VGS) of a negative two and one tenth volts (−2.1 V). The horizontal line in FIG. 8 through the $0.6 \times 10^{-10}$ amperes value crosses the first portion of curve C at a value of gate to source voltage (VGS) of a negative one and five hundredths volt (−1.05 V).

The failing point is defined at a value of a negative one half volt (−0.5 V). The operation window for curve C extends from a negative one and five hundredths volt (−1.05 V) to a negative one half volt (−0.5 V). Therefore, the operation window of curve C has a magnitude of fifty five hundredths of a volt (0.55 V).

The operation window for curve A of the present invention extends from a negative two and one tenth volts (−2.1 V) to a negative one half volt (−0.5 V). Therefore, the operation window of curve A has a magnitude of one and six tenths volt (1.60 V). From this it is seen that Curve A has an operation window that is more than twice as large as the operation window of curve C.

Therefore, for the same value of programming current (IG), the operation window for curve A will be greater than the operation window for curve C. This means the endurance of the memory cell of the present invention (curve A) will be greater than the endurance of the memory cell of the prior art (curve C).

If a value of floating gate voltage (VFG) shifts to the right (i.e., toward increasing values of floating gate voltage) at the same degradation rate, it will take approximately twice the number of program/erase cycles for the floating gate voltage (VFG) associated with curve A to shift to the failure point.

In addition, it is seen from FIG. 8 that curve A has a much higher value of program current (IG) than the program current of curve C. Compare curve A and curve C at one selected value of gate to source voltage (VGS). For example, consider the value of gate to source voltage (VGS) of negative one and three fourths volts (−1.75 V). The vertical line in FIG. 8 through the −1.75 V value shows that the value of program current (IG) in curve A is approximately $1.0 \times 10^{-10}$ amperes and that the value of program current (IG) in curve C is approximately $0.06 \times 10^{-10}$ amperes.

Therefore, for the same value of gate to source voltage (VGS), the programming time for curve A will be shorter than the programming time for curve C. This means the speed of programming of the memory cell of the present invention (curve A) will be faster than the speed of programming of the memory cell of the prior art (curve C).

Figure 9:
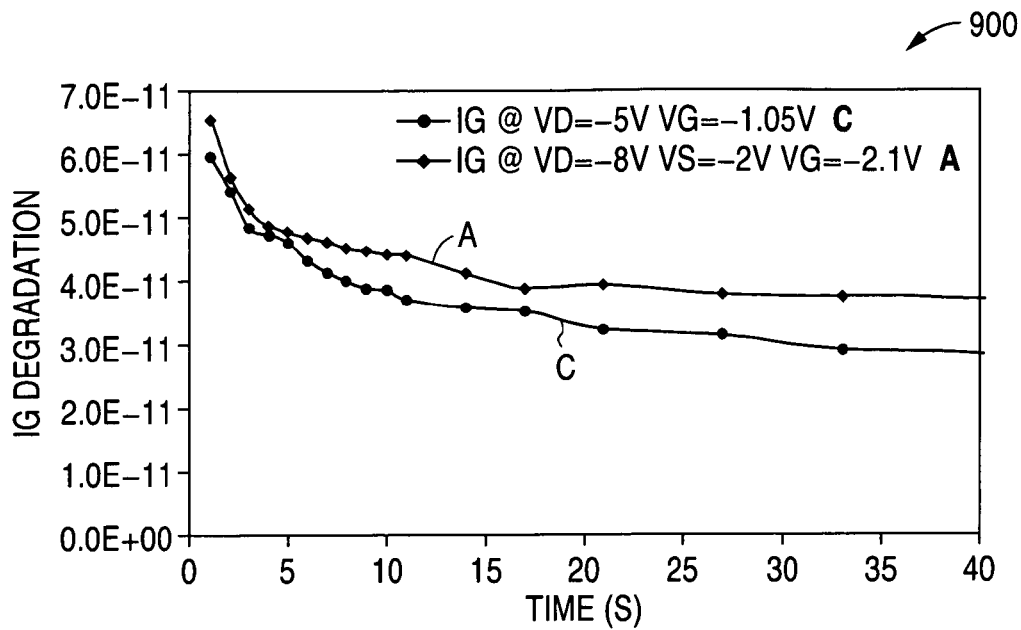
FIG. 9 illustrates a graph that shows values of program current as a function of time in a memory cell of the present invention and in a prior art memory cell.

FIG. 9 illustrates a graph 900 of the comparative degradation of program current (IG) for curve A and for curve C. Graph 900 plots the program current (IG) in amperes (A) versus time in seconds (s). The initial value of program current (IG) is approximately sixty picoamperes (60 pA). Experimental data plotted in graph 900 verifies that the program current degradation rate for curve A is slightly better than the program current degradation rate for curve C.

Figure 10:
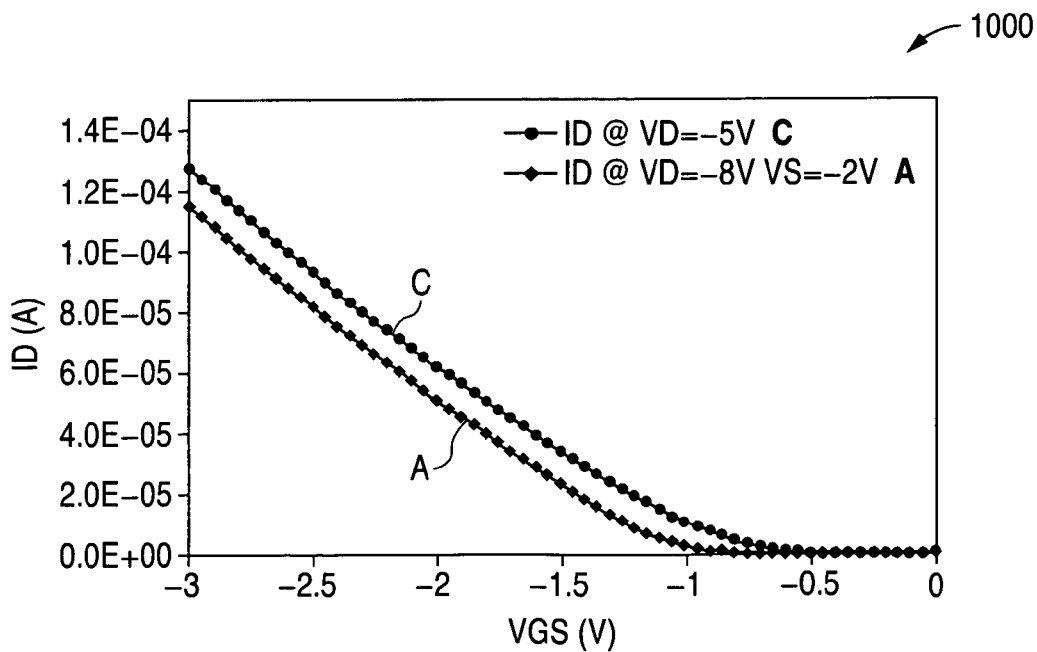
FIG. 10 illustrates a graph that shows values of channel current as a function of the gate to source voltage in a memory cell of the present invention and in a prior art memory cell.

FIG. 10 illustrates a graph 1000 of the comparative decrease of the channel current (ID) for curve A and for curve C. Graph 1000 plots the channel current (ID) in amperes (A) versus the gate to source voltage (VGS) in volts (V). Graph 1000 shows that with the source bias voltage (curve A) the channel current (ID) is lower than without the source bias voltage (curve C). This is so even if the drain-source bias voltage is larger. The drain-source bias voltage (VDS) is negative six volts (−6 V) with the source bias voltage (curve A). The drain-source bias voltage (VDS) is negative five volts (−5 V) without the source bias voltage (curve C). The reason for this result is that the presence of the source bias voltage increases the threshold voltage ($V_{th}$) and thus decreases the channel current (ID).

In the DAHC programming mechanism, the magnitude of the program current (IG) is determined by both the hot electron generation rate and the hot electron injection rate. The hot electron generation rate is determined by the product of the channel current and ionization rate. The ionization rate is determined by the lateral field at the drain edge. The lateral field at the drain edge is determined by the electric field in the channel pinch off region. The hot electron injection rate is determined by the vertical field along the drain edge, which is affected by both the gate voltage (VG) bias and the drain voltage (VD) bias.

In order to improve the endurance (i.e., cycling performance) of the memory cells, one effective approach is to increase the hot electron injection rate and to inhibit the hot electron generation rate. A high hot electron injection rate will still give the desired level of program current (IG) even if the hot electron generation rate is low.

It is well known that most hot electrons that are generated cannot be injected into the floating gate 230 unless they have (1) sufficient energy, (2) the right trajectory and (3) no further impact with the silicon lattice before they reach the floating gate 230. Hot electrons that reach the floating gate 230 may be said to be the "lucky" hot electrons.

Hot electrons that do not satisfy the three conditions mentioned above (i.e., the "unlucky" hot electrons) do not reach the floating gate 230 and do not contribute to changing the non-volatile memory (NVM) state of the memory cell. Instead, the "unlucky" electrons damage the gate oxide, create an interface between the silicon (Si) and the silicon dioxide ($SiO_2$), and thus degrade the cycling performance of the memory cell. Drain Avalanche Hot Electron (DAHC) programming is one mechanism to generate hot electrons.

The system and method of the present invention has several advantages. First, the source bias voltage applied to the source of the program transistor 710 increases the threshold voltage ($V_{th}$) of the program transistor 710. This lowers the magnitude of the channel current (ID) and therefore lowers the hot electron generation rate. Second, the source bias voltage increases the channel potential at the channel pinch off region of the program transistor 710. This reduces the lateral field and therefore decreases the impact ionization rate.

Third, adding the source bias voltage to the drain of the program transistor 710 increases the vertical field between the drain and gate of the program transistor 710. This increases the hot electron injection rate. Fourth, the increased magnitude of the threshold voltage ($V_{th}$) of the program transistor 710 decreases the channel current (ID) and therefore reduces power consumption.

In CMOS non-volatile memory (NVM) technology, the DAHC programming process creates more oxide damage than does the FN erase operation. The system and method of the present invention provides an asymmetrical memory cell design to accommodate the differences in oxide damage in order to improve the cycling performance of the memory cells. As previously mentioned, the system and method of the present invention provides a high coupling ratio for the FN erase process and provides a low coupling ratio for the DAHC programming by adjusting the gate capacitor area ratio. The low coupling ratio for the DAHC programming improves the cycling performance of the memory cells of the present invention.

As also previously mentioned with reference to FIG. 7, an exemplary width of the program transistor 710 is twice the width of the erase capacitor 240. Therefore, the size of the program transistor 710 is twice the size of the erase capacitor 240. This means that for a given density of program current (IG), the program current (IG) is increased by two times and the program time is decreased by half. The damage to the gate oxide in unit width is still the same. The resulting cycling performance of the memory cell is improved twice.

In the present invention the program transistor 710 and the source bias voltage from source bias voltage line 720 increases the programming voltage as it decreases the coupling ratio between the program transistor 710 and the control capacitor 220. However, the program voltage that is required is much lower than the voltage required for the FN erase process. This provides an acceptable trade-off in view of the improvement to be gained in the cycling performance of the memory cells.

The present invention has been described using a CMOS non-volatile memory cell as an example of a memory cell in which the system and method of the present invention may be applied. It is understood, however, that the system and method of the present invention is not limited to use in CMOS non-volatile memory cells. The system and method of the present invention may be used in any non-volatile memory cell that employs Drain Avalanche Hot Carrier (DAHC) programming (e.g., Flash memory having a stacked gate/split gate structure).

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A memory cell, comprising:
a program transistor having a gate;
a control capacitor having a gate coupled to the gate of the program transistor to form a floating gate; and
an erase capacitor having a gate coupled to the floating gate;
wherein a size of the program transistor is selected to create a desired value of a coupling ratio between the program transistor and the control capacitor; and
wherein the size of the program transistor is greater than a size of the erase capacitor.

2. The memory cell of claim 1, wherein the value of the coupling ratio is large enough to permit a desired level of performance of a Fowler-Nordheim erase process and small enough to permit a desired level of performance of a drain avalanche hot carrier program process in the memory cell.

3. The memory cell of claim 1, further comprising a read transistor having a gate coupled to the floating gate.

4. The memory cell of claim 3, wherein the size of the program transistor is greater than a size of the read transistor.

5. The memory cell of claim 1, wherein the size of the program transistor is two times larger than the size of the erase capacitor.

6. The memory cell of claim 5, wherein a value of program current in the memory cell is doubled and a value of program time is halved due to the size of the program transistor and the size of the erase capacitor.

7. The memory cell of claim 1, further comprising a source bias voltage line coupled to a source of the program transistor and operable to supply a source bias voltage to the source of the program transistor.

8. A memory cell, comprising:
a program transistor having a gate and a source;
a control capacitor having a gate coupled to the gate of the program transistor to form a floating gate; and
a source bias voltage line coupled to the source of the program transistor, the source bias voltage line operable to supply a source bias voltage to the source of the program transistor to increase a threshold voltage of the program transistor, wherein the increased threshold voltage of the program transistor is associated with a decrease of a magnitude of channel current in the program transistor and a decrease of a hot electron generation rate in the memory cell.

9. The memory cell of claim 8, wherein a size of the program transistor is selected to create a coupling ratio between the program transistor and the control capacitor that is large enough to permit a desired level of performance of a Fowler-Nordheim erase process and small enough to permit a desired level of performance of a drain avalanche hot carrier program process in the memory cell.

10. The memory cell of claim 8, further comprising an erase capacitor having a gate coupled to the floating gate.

11. The memory cell of claim 10, wherein a size of the program transistor is greater than a size of the erase capacitor.

12. The memory cell of claim 11, wherein the size of the program transistor is two times larger than the size of the erase capacitor.

13. The memory cell of claim 8, wherein the decrease of the magnitude of channel current in the program transistor is associated with a decrease of power consumption in the memory cell.

14. A memory cell, comprising:
a program transistor having a gate and a source;

a control capacitor having a gate coupled to the gate of the program transistor to form a floating gate; and a source bias voltage line coupled to the source of the program transistor, wherein the source bias voltage line is operable to supply a source bias voltage to the source of the program transistor to increase a channel potential at a channel pinch off region of the program transistor and to decrease an impact ionization rate in the memory cell.

15. A memory cell, comprising:

a program transistor having a gate and a source;

a control capacitor having a gate coupled to the gate of the program transistor to form a floating gate; and a source bias voltage line coupled to the source of the program transistor, wherein the source bias voltage line is operable to supply a source bias voltage to the source of the program transistor to increase a vertical field between a drain and the gate of the program transistor and to increase a hot electron injection rate in the memory cell.

16. A method of programming a memory cell comprising a program transistor and a control capacitor, each having a gate coupled together to form a floating gate, the method comprising the steps of:

selecting a size of the program transistor to create a desired coupling ratio between the program transistor and the control capacitor;

programming the memory cell with a drain avalanche hot carrier program process; and supplying a source bias voltage to a source of the program transistor during the drain avalanche hot carrier program process to increase a hot electron injection rate and to decrease a hot electron generation rate in the memory cell.

17. The method of claim 16, wherein the size of the program transistor is selected so that the coupling ratio is large enough to permit a desired level of performance of a Fowler-Nordheim erase process and small enough to permit a desired level of performance of the drain avalanche hot carrier program process.

18. The method of claim 16, wherein the source bias voltage increases a threshold voltage of the program transistor and decreases a magnitude of channel current in the program transistor to decrease the hot electron generation rate in the memory cell.

19. The method of claim 16, wherein the source bias voltage increases a channel potential at a channel pinch off region of the program transistor and decreases an impact ionization rate in the memory cell.

20. The method of claim 16, wherein the source bias voltage increases a vertical field between a drain and the gate of the program transistor to increase the hot electron injection rate in the memory cell.

* * * * *

UNITED STATES PATENT AND TRADEMARK OFFICE
CERTIFICATE OF CORRECTION

PATENT NO. : 7,586,792 B1  
APPLICATION NO. : 11/509790  
DATED : September 8, 2009  
INVENTOR(S) : Bu et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 261 days.

Signed and Sealed this

Twenty-first Day of September, 2010

David J. Kappos  
*Director of the United States Patent and Trademark Office*